(12) United States Patent
Zhu

(10) Patent No.: US 12,740,039 B2
(45) Date of Patent: Sep. 15, 2026

(54) MEMORY DEVICE, METHOD OF MANUFACTURING MEMORY DEVICE, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS. CHINESE ACADEMY OF SCIENCES, Beijing (CN)

( * ) Notice: Subject to any disclaimer, the term of this patent is extended or adjusted under 35 U.S.C. 154(b) by 646 days.

(21) Appl. No.: 18/311,528

(22) Filed: May 3, 2023

(65) Prior Publication Data

US 2023/0380132 A1 Nov. 23, 2023

(30) Foreign Application Priority Data

May 19, 2022 (CN) ......................... 202210560680.7

(51) Int. Cl.
*H10B 12/00* (2023.01)

(52) U.S. Cl.
CPC .................................... *H10B 12/00* (2023.02)

(58) Field of Classification Search
CPC ........ H10B 12/00; H10B 20/00; G11C 17/18; G11C 7/18
See application file for complete search history.

(56) References Cited

U.S. PATENT DOCUMENTS 9,673,304 B1 * 6/2017 Sano ...................... H10B 63/34
11,950,426 B2 * 4/2024 Karda .................... H10B 12/33
(Continued)

FOREIGN PATENT DOCUMENTS

CN 112909012 A 6/2021
CN 114121960 A 3/2022
(Continued)

OTHER PUBLICATIONS

First Office Action for Chinese Application No. 202210560680.7, dated Aug. 23, 2025, 11 Pages.

*Primary Examiner* — Marlon T Fletcher
*Assistant Examiner* — Kimberly Newman Frey
(74) *Attorney, Agent, or Firm* — Christopher R. Christenson; Kelly, Holt & Christenson, P.L.L.C.

(57) ABSTRACT

Disclosed are a memory device, a method of manufacturing the same, and an electronic apparatus. The memory device includes: first to fourth connection line layers sequentially disposed in a vertical direction, and adjacent connection line layers respectively include conductive lines extending in directions intersected; a plurality of memory cells respectively including first and second transistors stacked. A first active layer of the first transistor includes first and second source/drain regions respectively electrically connected with conductive lines in the first and second connection line layers. A second active layer of the second transistor includes a first source/drain region electrically connected with a gate conductor layer of the first transistor, and a second source/drain region electrically connected with a conductive line in the third connection line layer. A gate conductor layer of the second transistor of each memory cell is electrically connected to a conductive line in the fourth connection line layer.

20 Claims, 16 Drawing Sheets

(56) References Cited

U.S. PATENT DOCUMENTS

2021/0074767 A1* 3/2021 Lee ...................... G11C 13/003
2022/0122971 A1 4/2022 Peng et al.
2022/0359026 A1* 11/2022 Su .......................... G11C 17/18
2023/0020789 A1* 1/2023 Lee .................... G11C 16/3459
2024/0260272 A1* 8/2024 Song ...................... H10B 43/27

FOREIGN PATENT DOCUMENTS

WO 2014169506 A1 10/2014
WO 2020263340 A1 12/2020

* cited by examiner 1007
1005
1003
1001
A
A'

1051
1047

MEMORY DEVICE, METHOD OF MANUFACTURING MEMORY DEVICE, AND ELECTRONIC APPARATUS INCLUDING MEMORY DEVICE

CROSS REFERENCE TO RELATED APPLICATION

This application claims priority to Chinese Patent Application No. 202210560680.7, filed on May 19, 2022, the entire content of which is incorporated herein in its entirety by reference.

TECHNICAL FIELD

The present disclosure relates to a field of semiconductors, and in particular relates to a memory device, a method of manufacturing the memory device, and an electronic apparatus including the memory device.

BACKGROUND

Dynamic Random Access Memory (DRAM) generally uses a capacitor as a memory element. For example, one (1) transistor (T) as a switching device and one (1) capacitor (C) as a memory element are provided in a common 1T1C configuration. However, as a size of the memory device is further reduced, an area for fabricating the capacitor is gradually reduced, thus it is difficult to ensure that the capacitor has a sufficiently large capacitance to hold data.

A 2T0C configuration DRAM without a capacitor has been proposed. A read transistor and a write transistor are provided in such configuration, and a gate capacitance of the read transistor may replace the capacitor as a memory element. However, the 2T0C configuration may occupy a relatively large area.

SUMMARY

In view of the above, an object of the present disclosure is at least partially to provide an area-saving memory device, a method of manufacturing the memory device, and an electronic apparatus including the memory device.

According to an aspect of the present disclosure, a memory device is provided, including: a first connection line layer, a second connection line layer, and a third connection line layer that are sequentially disposed in a vertical direction with respect to a substrate, wherein the first connection line layer includes a plurality of first conductive lines extending parallel to each other in a first direction, the second connection line layer includes a plurality of second conductive lines extending parallel to each other in a second direction intersecting the first direction, and the third connection line layer includes a plurality of third conductive lines extending parallel to each other in the first direction; a plurality of memory cells, wherein each memory cell extends vertically from a corresponding first conductive line in the first connection line layer and passes through a corresponding second conductive line in the second connection line layer and a corresponding third conductive line in the third connection line layer, and each memory cell includes a first transistor and a second transistor that are stacked on each other in the vertical direction, wherein the first transistor includes: a first active layer, including a first source/drain region electrically connected with the corresponding first conductive line in the first connection line layer, a second source/drain region electrically connected with the corresponding second conductive line in the second connection line layer, and a channel region between the first source/drain region of the first transistor and the second source/drain region of the first transistor; a first gate dielectric layer on the first active layer; and a first gate conductor layer on the first gate dielectric layer, and the second transistor includes: a second active layer, including a first source/drain region electrically connected with the first gate conductor layer, a second source/drain region electrically connected with the corresponding third conductive line in the third connection line layer, and a channel region between the first source/drain region of the second transistor and the second source/drain region of the second transistor, wherein portions where the first active layer is adjacent to the second active layer are substantially aligned in the vertical direction; a second gate dielectric layer on the second active layer; and a second gate conductor layer on the second gate dielectric layer; and a fourth connection line layer above the memory cell, including a plurality of fourth conductive lines extending in the second direction, wherein the second gate conductor layer of each memory cell is electrically connected to a corresponding fourth conductive line in the fourth connection line layer.

According to another aspect of the present disclosure, a method of manufacturing a memory device is provided, including: forming a first isolation layer on a substrate; forming a first connection line layer on the first isolation layer, and patterning the first connection line layer as a plurality of first conductive lines extending parallel to each other in a first direction; forming a second isolation layer on the first isolation layer and the first connection line layer; forming a second connection line layer on the second isolation layer, and patterning the second connection line layer as a plurality of second conductive lines extending parallel to each other in a second direction intersecting the first direction; forming a third isolation layer on the second isolation layer and the second connection line layer; forming a third connection line layer on the third isolation layer, and patterning the third connection line layer as a plurality of third conductive lines extending parallel to each other in the first direction; forming a fourth isolation layer on the third isolation layer and the third connection line layer; forming a plurality of openings, wherein each opening passes through the fourth isolation layer, a corresponding third conductive line in the third connection line layer, the third isolation layer, a corresponding second conductive line in the second connection line layer, and the second isolation layer, and enters a corresponding first conductive line in the first connection line layer; forming, in the each opening, a first transistor and a second transistor that are stacked on each other in the vertical direction to form a memory cell, wherein the first transistor includes: a first active layer, including a first source/drain region electrically connected with the corresponding first conductive line in the first connection line layer, a second source/drain region electrically connected with the corresponding second conductive line in the second connection line layer, and a channel region between the first source/drain region of the first transistor and the second source/drain region of the first transistor; a first gate dielectric layer on the first active layer; and a first gate conductor layer on the first gate dielectric layer, and the second transistor includes: a second active layer, including a first source/drain region electrically connected with the first gate conductor layer, a second source/drain region electrically connected with the corresponding third conductive line in the third connection line layer, and a channel region between the first source/drain region of the second transistor and the second source/drain region of the second transistor, wherein portions where the first active layer is adjacent to the second active layer are substantially aligned in the vertical direction; a second gate dielectric layer on the second active layer; and a second gate conductor layer on the second gate dielectric layer; and forming a fourth connection line layer on the fourth isolation layer, wherein the fourth connection line layer includes a plurality of fourth conductive lines extending in the second direction, and the second gate conductor layer of each memory cell is electrically connected to a corresponding fourth conductive line in the fourth connection line layer.

According to another aspect of the present disclosure, an electronic apparatus including the memory device described above is provided.

According to embodiments of the present disclosure, a memory device is provided, wherein transistors constituting a memory cell are stacked on each other, so as to save area. In particular, transistors stacked on each other in each memory cell may be self-aligned in a vertical direction.

BRIEF DESCRIPTION OF THE DRAWINGS

The above and other objectives, features and advantages of the present disclosure will be more apparent through the following descriptions of embodiments of the present disclosure with reference to the accompanying drawings, in which:

FIG. 15 schematically shows an equivalent circuit diagram of a memory cell according to an embodiment of the present disclosure, in which:

FIGS. 1(*a*), 3(*a*), 6(*a*), 9(*a*), and 10(*a*) are top views, and positions of line AA' and line BB' are shown in FIG. 1(*a*), FIGS. 1(*b*), 3(*b*), 4(*a*), 5(*a*), 6(*b*), 9(*b*), 10(*b*), 11(*a*), 12(*a*), 13(*a*), and 14(*a*) are cross-sectional views along line AA', and FIGS. 1(*c*), 2, 4(*b*), 5(*b*), 6(*c*), 7, 8, 9(*c*), 9(*d*), 10(*c*), 11(*b*), 12(*b*), 13(*b*), and 14(*b*) are cross-sectional views along line BB'.

Throughout the accompanying drawings, the same or similar reference numerals indicate the same or similar components.

DETAILED DESCRIPTION OF EMBODIMENTS

Figures 1A, 1B:
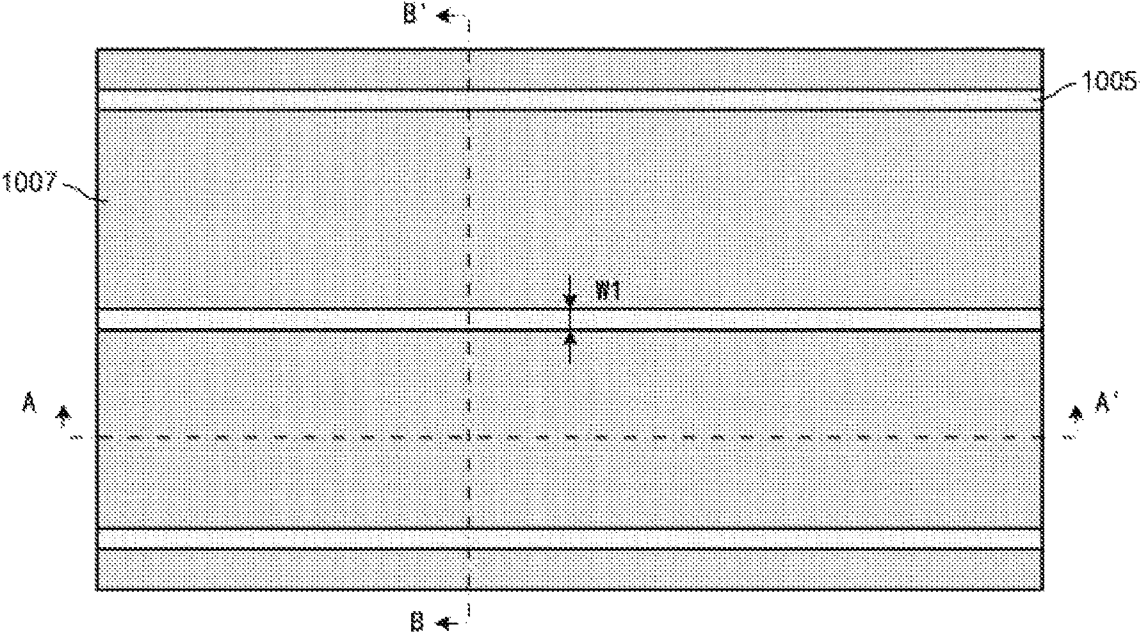
FIG. 1(*a*) to FIG. 10(*c*) show schematic diagrams of some stages in a process of manufacturing a memory device according to an embodiment of the present disclosure.

Embodiments of the present disclosure will be described below with reference to the accompanying drawings. However, it should be understood that the descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to embodiments of the present disclosure are shown in the accompanying drawings. The drawings are not drawn to scale. Some details are enlarged and some details may be omitted for clarity of presentation. Shapes of various regions and layers as well as relative sizes and positional relationships of the various regions shown in the drawings are only exemplary. In practice, there may be deviations due to manufacturing tolerances or technical limitations, and those skilled in the art may additionally design regions/layers with different shapes, sizes, and relative positions according to actual requirements.

In the context of the present disclosure, when a layer/element is referred to as being "on" a further layer/element, the layer/element may be directly on the further layer/element, or there may be an intermediate layer/element between them. In addition, if a layer/element is located "on" a further layer/element in one orientation, the layer/element may be located "under" the further layer/element when the orientation is reversed.

A memory device according to embodiments of the present disclosure is based on a vertical device. The vertical device may include a vertical active region with respect to a substrate, including source/drain regions located at upper and lower ends of the vertical active region and a channel region located between the source/drain regions. A conductive channel may be formed between the source/drain regions through the channel region.

According to the embodiments of the present disclosure, a position of a source/drain region in the active region may be defined through an electrode. For example, the active region may be defined by a semiconductor layer that extends substantially in a vertical direction (a direction substantially perpendicular to a surface of the substrate) (considering a manufacturing process, there may be a laterally extending bottom, as described below). Regions (e.g., regions at upper and lower ends of the semiconductor layer) in the semiconductor layer that are connected to the electrode (e.g., a conductive line or a gate length control pad described below) may form source/drain regions, and a region between the source/drain regions may form a channel region. A gate conductor layer may face the channel region via a gate dielectric layer to control the channel region.

The memory device according to the embodiments of the present disclosure may be a Dynamic Random Access Memory (DRAM) and may have a capacitance free configuration, such as a 2T0C configuration. In the 2T0C configuration, each memory cell of the memory device may have two transistors, i.e., a first transistor (e.g., a read transistor) and a second transistor (e.g., a write transistor). As described above, the two transistors may be vertical devices, and thus may be easily stacked on each other, thereby saving area. Each of the two transistors may be defined by a corresponding active region (combined with a corresponding gate stack), and may be self-aligned as described below. For example, portions (for example, the vertically extending semiconductor layer described above) where respective active layers of the two transistors are adjacent may be substantially aligned in the vertical direction. In addition, an isolation portion may be provided between (active regions of) the two transistors to achieve electrical isolation. As described below, the isolation portion may also be self-aligned. A self-aligning configuration may further save area.

The electrode may include a bit line and a word line of the memory device. According to the embodiments of the present disclosure, a plurality of connection line layers at different levels may be provided to respectively define source/drain regions at different heights of the active region. For example, a first connection line layer, a second connection line layer, and a third connection line layer may be provided, which include conductive materials, and may be respectively patterned as a first conductive line, a second conductive line, and a third conductive line. In order to facilitate a fabrication of an array, conductive lines in connection line layers adjacent in the vertical direction may extend in directions that intersecting (e.g., perpendicular to) each other, so that the conductive lines may intersect each other, and a memory cell may be formed at an intersection. The first connection line layer may be disposed at a vertical height of a lower end of the active region of the first transistor to define a lower source/drain region of the first transistor. The second connection line layer may be disposed at a vertical height of an upper end of the active region of the first transistor to define an upper source/drain region of the first transistor. The third connection line layer may be disposed at a vertical height of an upper end of an active region of the second transistor to define an upper source/drain region of the second transistor. In a case of the 2T0C configuration, a gate electrode of the first transistor may be electrically connected to a source/drain region (for example, a lower source/drain region) of the second transistor. Therefore, for the second transistor, the lower source/drain region of the second transistor may be defined by the gate conductor layer of the first transistor without additionally providing a corresponding connection line layer. In addition, a fourth connection line layer including a fourth conductive line may also be provided to achieve an electrical connection to a gate electrode of each second transistor. In the case of the 2T0C configuration, the first conductive line may be one of a read bit line (RBL) and a read word line (RWL), the second conductive line may be the other of the read bit line (RBL) and the read word line (RWL), the third conductive line may be a write bit line (WBL), and the fourth conductive line may be a write word line (WWL).

Each memory cell may be formed to pass through these connection line layers (the first to third connection line layers described above, and for the lowest first connection line layer, only a portion of a thickness of the first connection line layer may be passed through) used to define the source/drain regions. That is, each memory cell may be formed in an opening where the conductive lines intersect each other. A semiconductor layer (hereinafter referred to as a "first active layer") used as an active region in the first transistor may be formed along a sidewall of the opening, and may further extend along a bottom wall of the opening due to a manufacturing process. Accordingly, the first active layer may be in a cup shape. A first gate dielectric layer of the first transistor may extend along an inner wall of the cup-shaped first active layer, and an inner space of the first gate dielectric layer may be filled with a first gate conductor layer. Similarly, a semiconductor layer (hereinafter referred to as a "second active layer") used as an active region in the second transistor may be formed along the sidewall of the opening, and may further extend along a top portion of the first transistor due to a manufacturing process. Accordingly, the second active layer may also be in a cup shape. A second gate dielectric layer of the second transistor may extend along an inner wall of the cup-shaped second active layer, and an inner space of the second gate dielectric layer may be filled with the second gate conductor layer. The two transistors may be formed in an opening formed based on a same mask, and thus may be self-aligned with each other. For example, portions where respective outer sidewalls of the two transistors are adjacent may be substantially coplanar in the vertical direction (defined by the inner sidewall of the opening).

The first transistor and the second transistor may be in substantially the same or similar forms: a cup-shaped active layer; a gate stack (including a gate dielectric layer and a gate conductor layer) disposed on an inner side of the cup-shaped active layer; and a connection line layer disposed outside the cup-shaped active layer, to define the source/drain region. Respective active layers and gate stacks of the first transistor and the second transistor may have the same configuration, but may also have different configurations to further optimize device performance. For example, when used as a read transistor, the first active layer of the first transistor may include a semiconductor material with a relatively high mobility to reduce a read time (or increase a read speed); and when used as a write transistor, the second active layer of the second transistor may include a semiconductor material with a relatively low leakage or a relatively large bandgap width to increase a data retention capability.

In order to achieve an electrical isolation between the first active layer and the second active layer, an isolation portion may be provided between the first active layer and the second active layer. Such isolation portion may be achieved as a spacer formed on the sidewall of the opening, and thus may be self-aligned between the first active layer and the second active layer. Here, the isolation portion may expose the first gate conductor layer to achieve an electrical connection between the lower source/drain region of the second transistor and the gate electrode of the first transistor as described above. For example, the second active layer may be in direct physical contact with the first gate conductor layer. On the one hand, due to a presence of the first gate conductor layer, a lower source/drain region is defined at a corresponding position of the second active layer. On the other hand, the direct physical contact between the second active layer and the first gate conductor layer achieves the electrical connection between the lower source/drain region of the second transistor and the gate electrode of the first transistor. Alternatively, a connection portion such as a metal may be additionally provided between the second active layer and the first gate conductor layer to reduce a contact resistance between the two.

For example, such memory device may be manufactured as follows.

A plurality of isolation layers and a plurality of connection line layers, e.g., the first isolation layer, the first connection line layer, the second isolation layer, the second connection line layer, the third isolation layer, the third connection line layer, and the fourth isolation layer, may be alternately disposed on the substrate. As described above, each connection line layer may be patterned as a corresponding conductive line. Openings may be formed at the intersections of the conductive lines, so that the openings may pass through each connection line layer in the vertical direction (for the lowest first connection line layer, only a portion of a thickness of the first connection line layer may be passed through). The memory cell may be formed in each opening. As described above, each memory cell may include a first transistor and a second transistor that are stacked on each other. The transistor may be formed by sequentially forming the corresponding active layer, gate dielectric layer, and gate conductor layer into the opening. After forming the first transistor and before forming the second transistor, an isolation portion may be formed on the sidewall of the opening through a spacer process to shield a top end of the first active layer. In addition, after forming the isolation portion and before forming the second transistor, a connection portion (e.g., a metal) that is in physical contact with the first gate conductor layer may also be formed on the first transistor in the opening. In addition, a fourth connection line layer including a fourth conductive line may also be formed on the fourth isolation layer to achieve an electrical connection to the gate electrode of each second transistor.

The present disclosure may be presented in various forms, some examples of which will be described below. In the following description, a selection of various materials is involved. In the selection of materials, in addition to a function of the material (for example, a semiconductor material may be used to form the active region, a dielectric material may be used to form an electrical isolation, and a conductive material may be used to form an electrode, an interconnection structure, and the like), the etching selectivity is also considered. In the following description, the required etching selectivity may or may not be indicated. It should be clear to those skilled in the art that when etching a material layer is mentioned below, if it is not mentioned or shown that other layers are also etched, then the etching may be selective, and the material layer may have an etching selectivity with respect to other layers exposed to the same etching recipe.

Figure 1C:
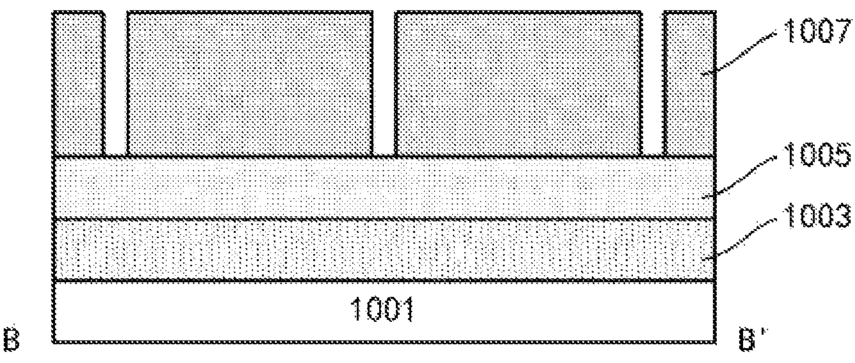
Figure 9A:
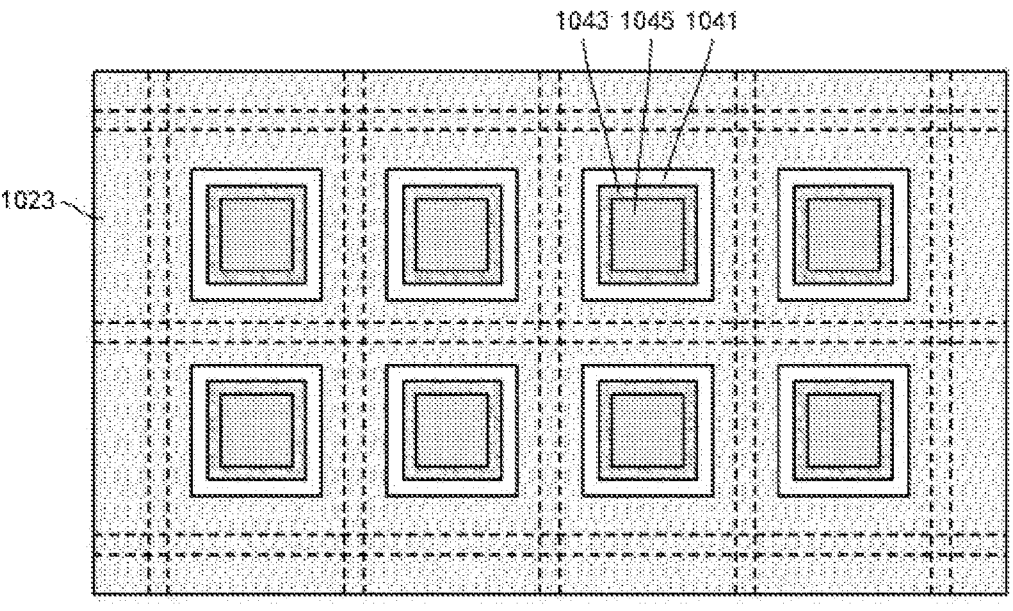
Figure 9B:
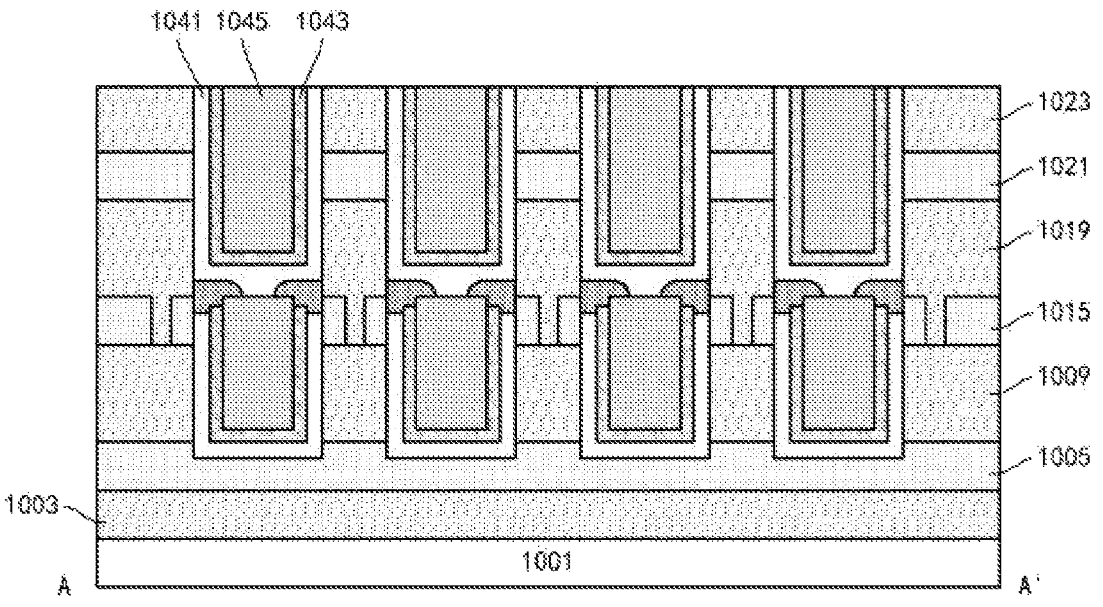
Figure 9C:
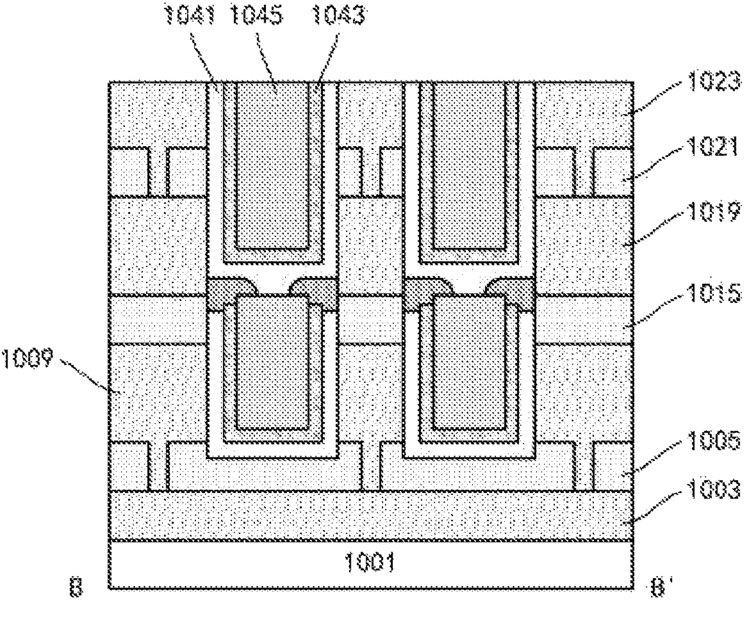
Figures 9D, 10A:
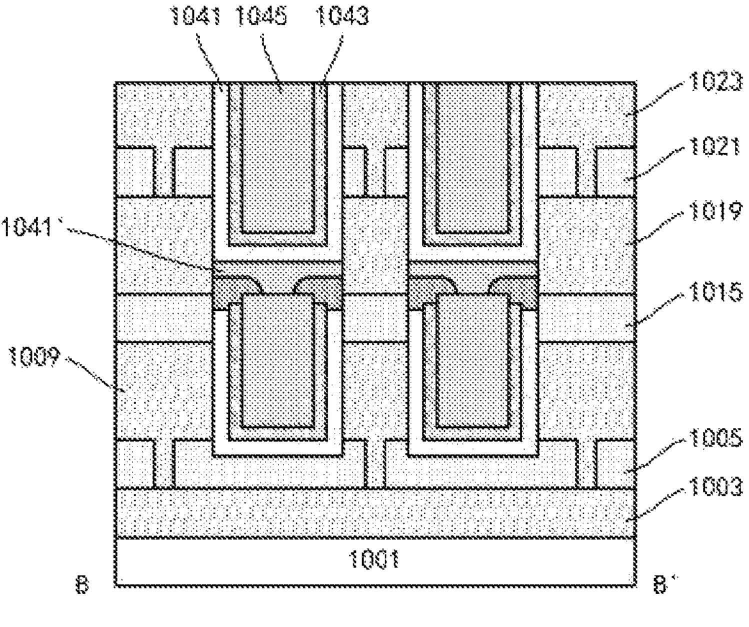
Figure 10B:
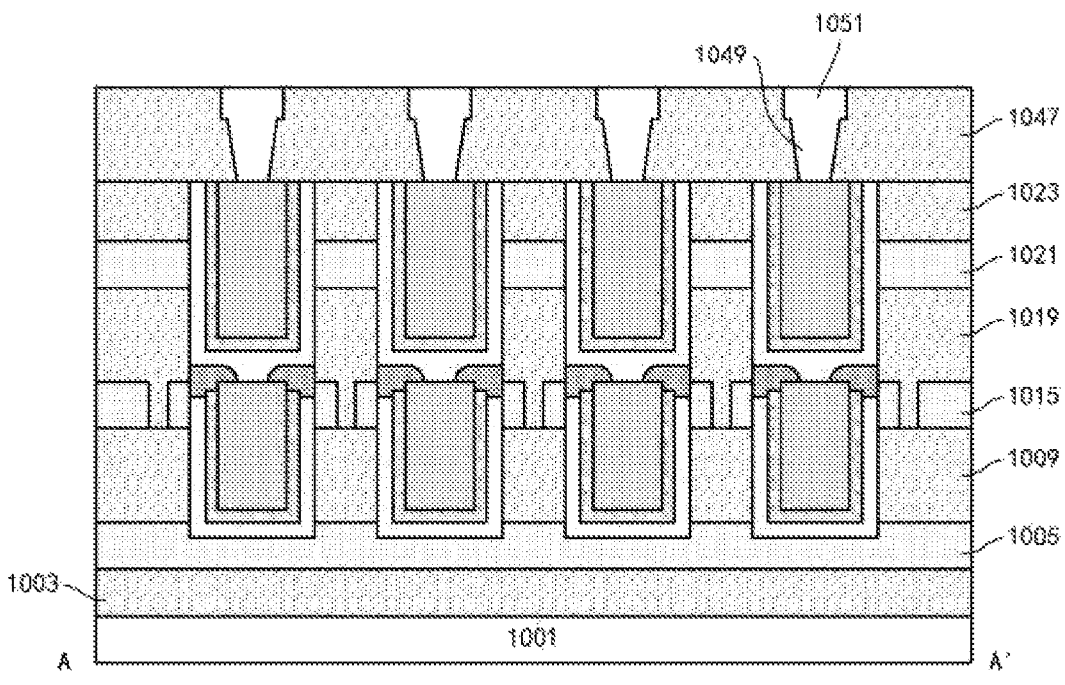
Figure 10C:
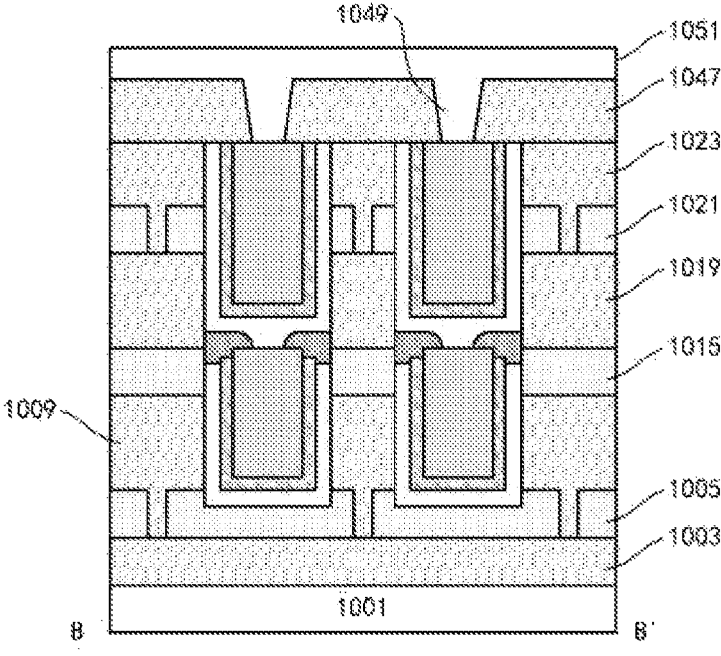

FIG. 1(*a*) to FIG. 10(*c*) show schematic diagrams of some stages in a process of manufacturing a memory device according to an embodiment of the present disclosure.

As shown in FIG. 1(*a*), FIG. 1(*b*), and FIG. 1(*c*), a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following description, for convenience of explanation, the bulk Si substrate such as a Si wafer is taken as an example for description.

On the substrate 1001, a first isolation layer 1003 and a first connection line layer 1005 may be formed, for example, by deposition. The first isolation layer 1003 may include a dielectric material such as an oxide (e.g., silicon oxide) to achieve electrical isolation, and have a thickness of, for example, about 20 nm to 200 nm. The first connection line layer 1005 may include a conductive material such as a metal, e.g., molybdenum (Mo), ruthenium (Ru), and the like, and have a thickness of, for example, about 5 nm to 100 nm. As described below, the first connection line layer 1005 may define RBL or RWL. As bit lines or word lines, there may be several conductive lines that extend parallel in a certain direction.

To this end, as shown in FIG. 1(*a*), FIG. 1(*b*), and FIG. 1(*c*), a photoresist 1007 may be formed on the first connection line layer 1005 and patterned as lines extending in a first direction (a horizontal direction on a paper plane in FIG. 1 (*a*)) by photolithography. A line width of the lines may be about 20 nm to 500 nm, and a spacing W1 between the lines may be about 10 nm to 50 nm.

Figure 2:
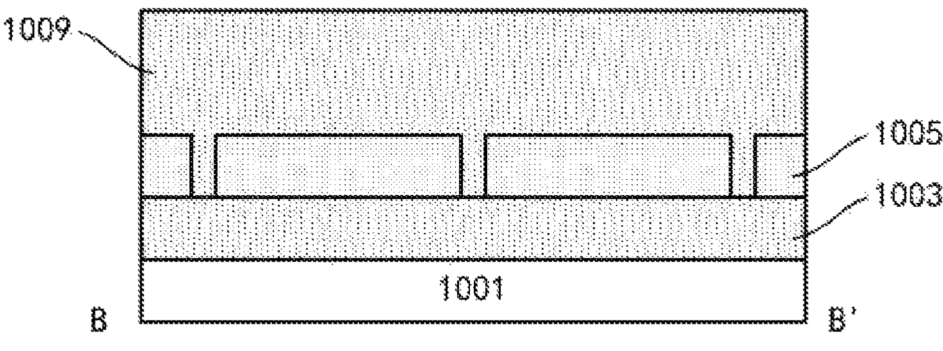

As shown in FIG. 2, selective etching, such as reactive ion etching (RIE) in the vertical direction, may be performed on the first connection line layer 1005 with the patterned photoresist 1007 as a mask. The RIE may stop at the first isolation layer 1003 below. Accordingly, the first connection line layer 1005 may be patterned as a pattern corresponding to the photoresist 1007, i.e., first conductive lines extending parallel in the first direction. After that, the photoresist 1007 may be removed.

On the first connection line layer 1005, a second isolation layer 1009 may be formed, for example, by deposition. The second isolation layer 1009 may include a dielectric material such as an oxide, a nitride (e.g., silicon nitride), a carbide (e.g., silicon carbide), and the like to achieve electrical isolation. Here, a deposition thickness of the second isolation layer 1009 may be controlled to be greater than W1/2 to fill a spacing between the first conductive lines in the first connection line layer 1005, and to achieve a sufficiently flat top surface to avoid a use of a planarization process such as a chemical mechanical polishing (CMP). Avoiding the use of the planarization process may allow the thickness (especially a thickness of the second isolation layer 1009 on the first connection line layer 1005) of the second isolation layer 1009 to be better controlled, as the thickness of the second isolation layer 1009 may then define a gate length (or a channel length) of the read transistor. For example, the thickness of the second isolation layer 1009 (on the first connection line layer 1005) may be about 10 nm to 100 nm.

Figure 3A:
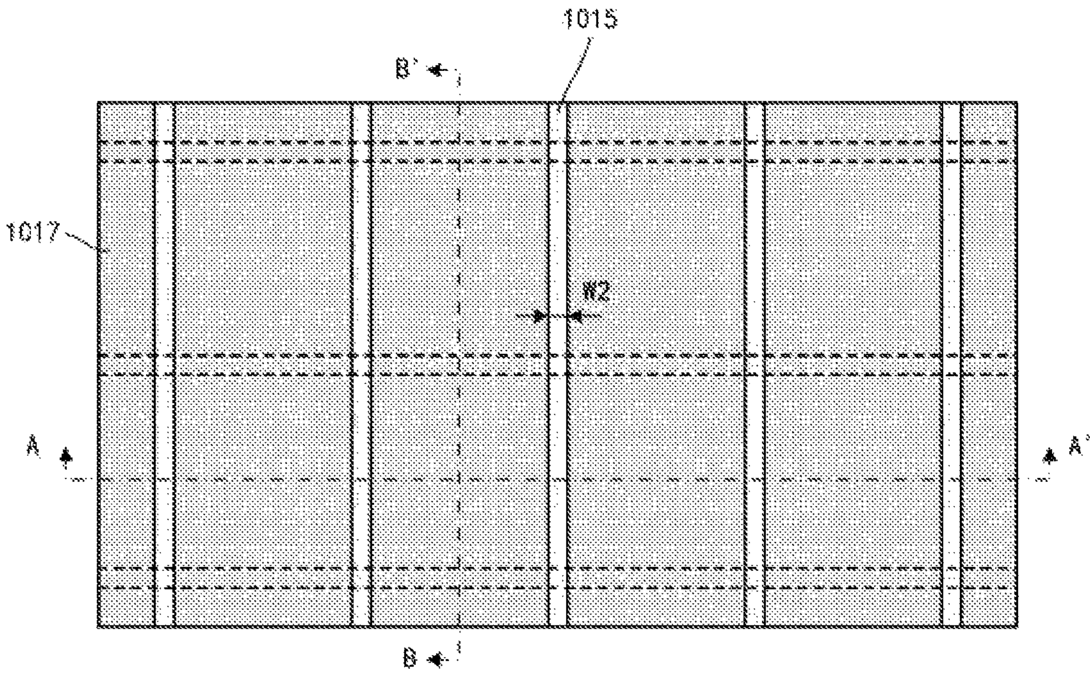
Figure 3B:
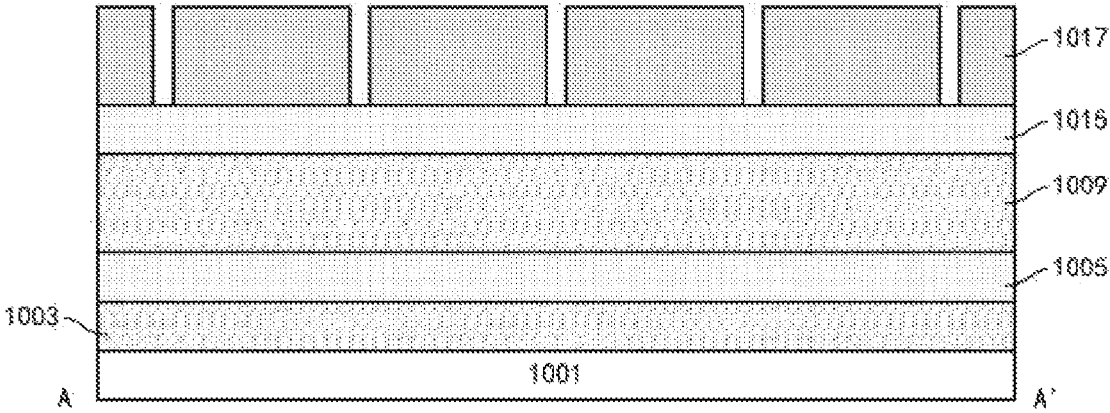

As shown in FIG. 3(*a*) and FIG. 3(*b*), a second connection line layer 1015 may be formed on the second isolation layer 1009, for example, by deposition. Similarly, the second connection line layer 1015 may include a conductive material such as a metal, e.g., Mo, Ru, and the like, and have a thickness of, e.g., about 5 nm to 20 nm. As described below, the second connection line layer 1015 may define RWL (when the first connection line layer 1005 defines RBL) or RBL (when the first connection line layer 1005 defines RWL). In order to facilitate a formation of an array of memory cells, the RWL or RBL defined by the second connection line layer 1015 may be formed as a conductive line extending in a direction that intersects (e.g., perpendicular to) the RBL or RWL defined by the first connection line layer 1015.

To this end, as shown in FIG. 3(*a*) and FIG. 3(*b*), a photoresist 1017 may be formed on the second connection line layer 1015 and patterned by photolithography as lines extending in a second direction (a vertical direction on a paper plane in FIG. 3(*a*)) that intersects (e.g., perpendicular to) the first direction. A line width of the lines may be about 20 nm to 500 nm, and a spacing W2 between the lines may be about 10 nm to 50 nm.

Figure 4A:
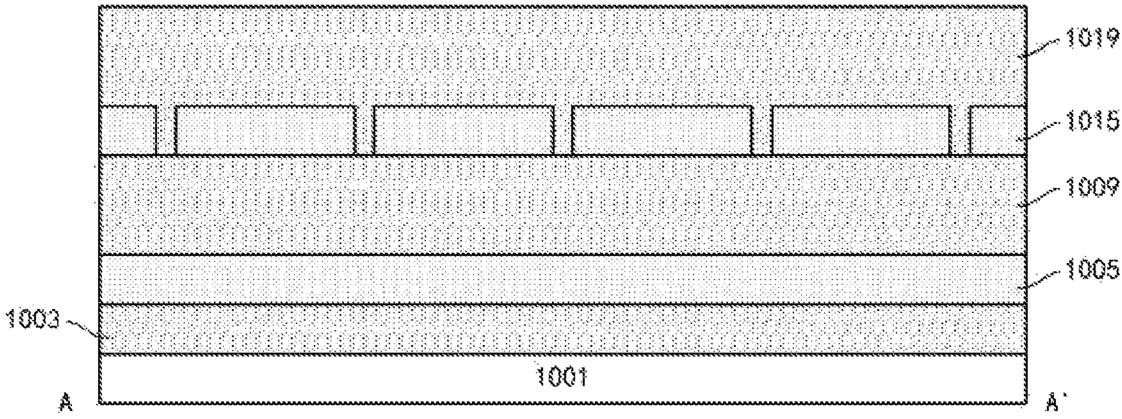
Figure 4B:
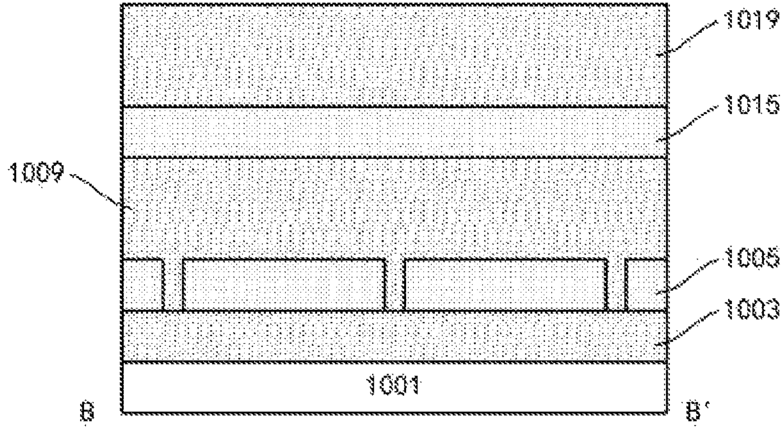

As shown in FIG. 4(*a*) and FIG. 4(*b*), selective etching, such as RIE in the vertical direction, may be performed on the second connection line layer 1015 with the patterned photoresist 1017 as a mask. The RIE may stop at the second isolation layer 1009 below. Accordingly, the second connection line layer 1015 may be patterned as a pattern corresponding to the photoresist 1017, i.e., second conductive lines extending parallel in the second direction. After that, the photoresist 1017 may be removed.

On the second connection line layer 1015, a third isolation layer 1019 may be formed, for example, by deposition. The third isolation layer 1019 may include a dielectric material such as an oxide, a nitride, a carbide, and the like to achieve electrical isolation. Similarly, a deposition thickness of the third isolation layer 1019 may be controlled to be greater than W2/2 to fill a spacing between the second conductive lines in the second connection line layer 1015, and to achieve a sufficiently flat top surface to avoid the use of the planarization process. Avoiding the use of the planarization process may allow the thickness (especially a thickness of the third isolation layer 1019 on the second connection line layer 1015) of the third isolation layer 1019 to be better controlled, as the thickness of the third isolation layer 1019 may then define a gate length (or a channel length) of the write transistor. For example, the thickness of the third isolation layer 1019 (on the second connection line layer 1015) may be about 20 nm to 200 nm.

Figure 5A:
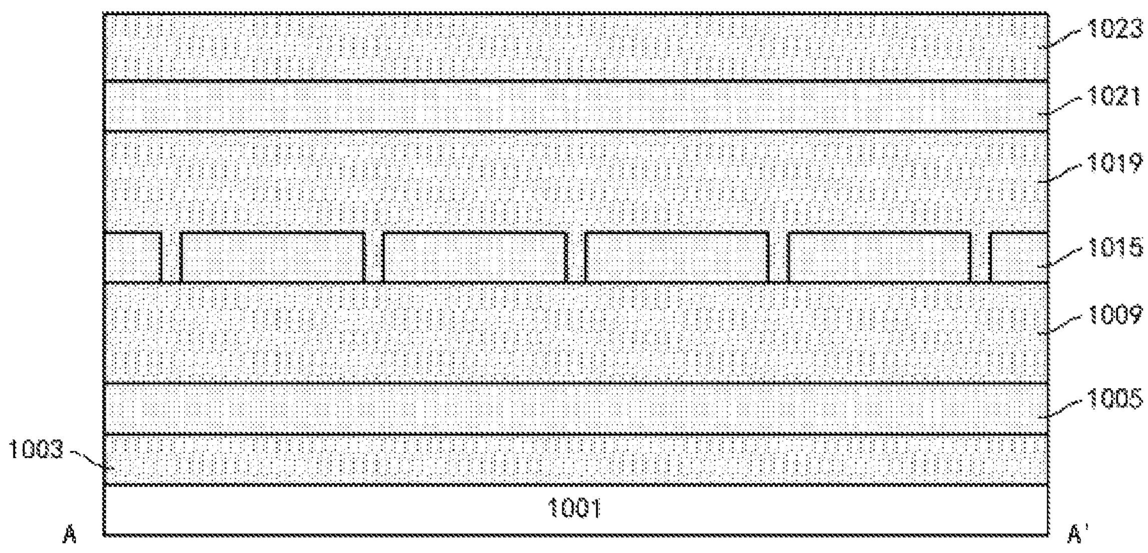
Figure 5B:
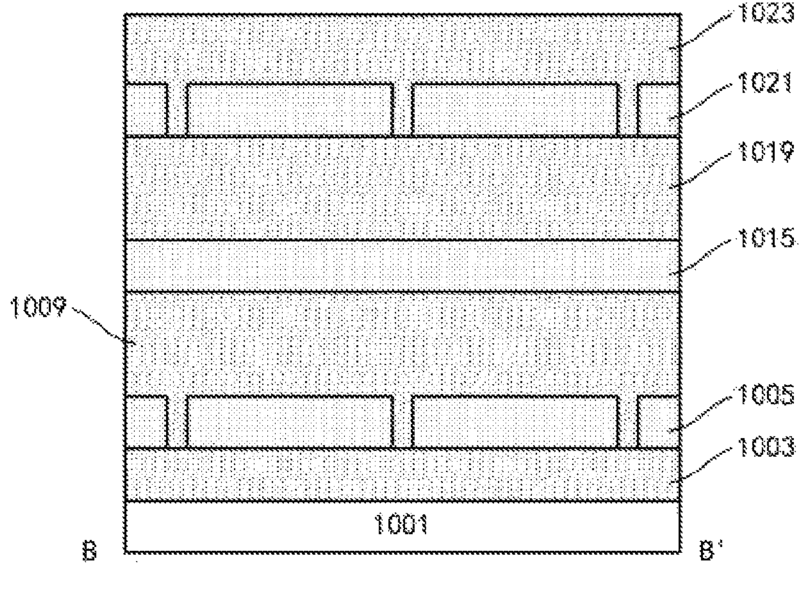

As shown in FIG. 5(*a*) and FIG. 5(*b*), a third connection line layer 1021 and a fourth isolation layer 1023 may be formed on the third isolation layer 1019. The third connection line layer 1021 may include a conductive material such as a metal, e.g., Mo, Ru, and the like, and have a thickness of, for example, about 5 nm to 20 nm. As described below, the third connection line layer 1021 may define a WBL.

Here, as a write bit line, it may be a conductive line extending in a direction that intersects (e.g., perpendicular to) a conductive line (e.g., the second conductive line in the second connection line layer 1015) in an adjacent conductive layer.

In this example, the third connection line layer 1021 is shown as substantially the same pattern as the first connection line layer 1005, and for example, the same mask may be used. Therefore, the above description in conjunction with FIG. 1(*a*), FIG. 1(*b*), FIG. 1(*c*), and FIG. 2 may be referred for the pattern of the third connection line layer 1021, which will not be repeated here. However, the present disclosure is not limited to this. As long as there are overlapping portions between the conductive lines in the connection line layers in the vertical direction, it is possible to form openings in the overlapping portions and form memory cells within the openings as described below.

The fourth isolation layer 1023 may include a dielectric material such as an oxide, a nitride, a carbide, and the like to achieve electrical isolation. The fourth isolation layer 1023 may be formed by using the same process as the second isolation layer 1009. Therefore, the above description in conjunction with FIG. 2 may be referred for the formation of the fourth isolation layer 1023, which will not be repeated here.

Through the above processes, conductive lines (bit lines or word lines) that intersect each other are formed, and the memory cell may be formed at an intersection of the conductive lines. More specifically, the conductive lines that intersect each other define regions arranged in an array on the substrate, and the memory cells (two transistors may be formed in the 2T0C configuration) may be formed in the regions.

Spaces for active regions of the transistors in the memory cells may be defined in the regions.

Figure 6A:
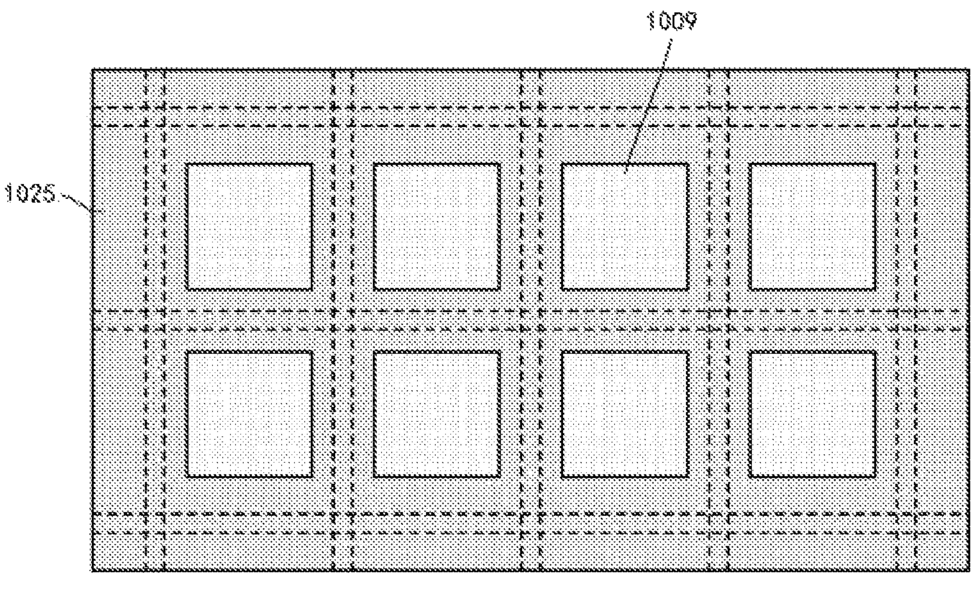
Figure 6B:
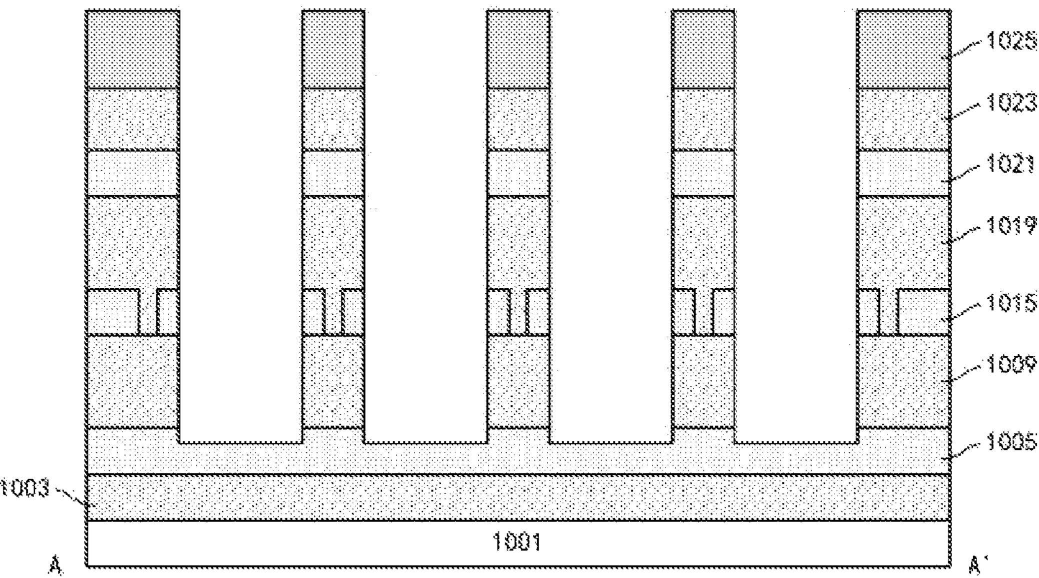
Figure 6C:
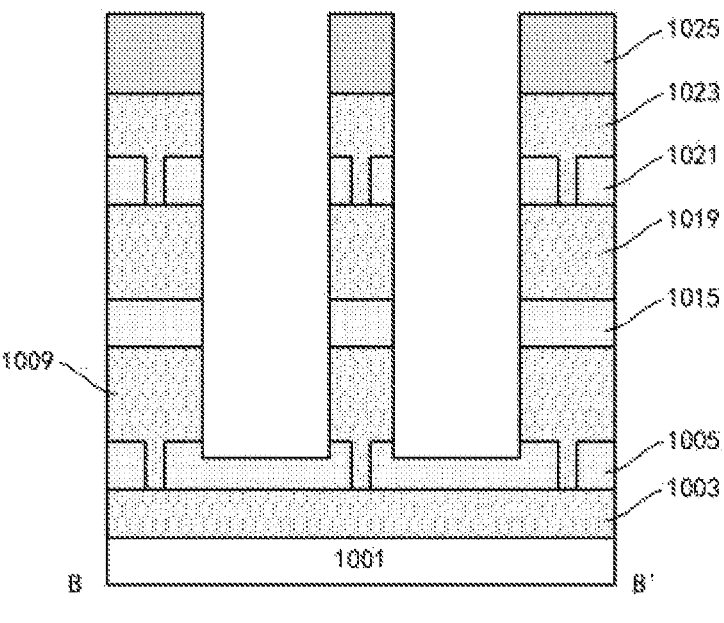

For example, as shown in FIG. 6(*a*), FIG. 6(*b*), and FIG. 6(*c*), a photoresist 1025 may be formed on the fourth isolation layer 1023. The photoresist 1025 may be patterned as a series of openings by photolithography to expose regions where the conductive lines intersect each other. Although the opening in the photoresist 1025 is shown as square, a shape of the opening is not limited to this. The shape of the opening may include various other shapes suitable for manufacturing, such as rectangular, circular, and the like.

Selective etching, such as RIE in the vertical direction, may be performed on underlying layers with the patterned photoresist 1025 as a mask. The RIE may be performed into the first connection line layer 1005 (but not to a bottom portion of the first connection line layer 1005, retaining a certain thickness of the first connection line layer 1005 may increase a contact area between a first transistor formed as follows and the first connection line layer 1005, so as to reduce a contact resistance). Accordingly, a series of openings arranged in an array may be formed. After that, the photoresist 1025 may be removed.

In this way, each of the conductive lines in the first connection line layer 1005, the second connection line layer 1015, and the third connection line layer 1021 has an opening corresponding to the photoresist 1025. In this example, each conductive line remains continuously extending in the first direction or the second direction, and is not completely disconnected by the opening. In particular, each conductive line has a material that continuously extends around a periphery of the opening. However, the present disclosure is not limited to this. For example, for at least some conductive lines, the opening may not be completely surrounded by the corresponding conductive line (for example, the corresponding conductive line may be biased on one side of the opening, thereby only surrounding a portion of a sidewall of the opening).

In each opening, two vertical transistors that are stacked on each other may be formed.

Figure 7:
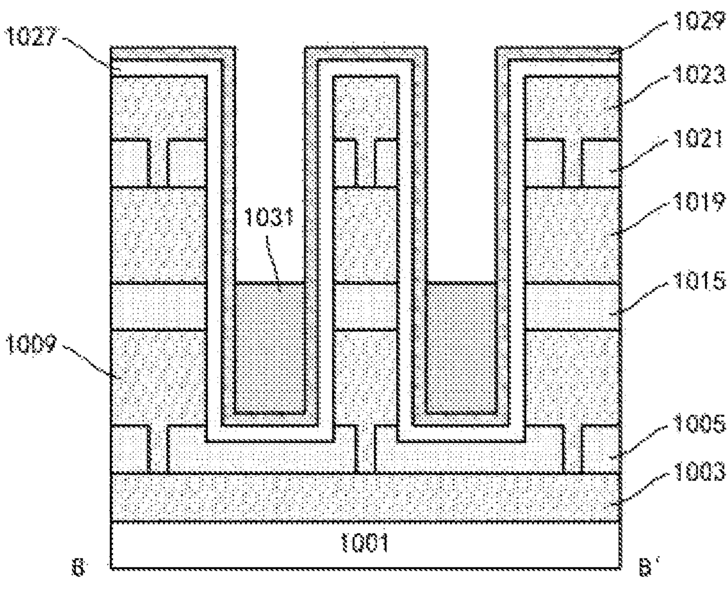

For example, as shown in FIG. 7, a first active layer 1027 may be formed in a substantially conformal manner by deposition such as direct current (DC) magnetron sputtering, radio frequency (RF) magnetron sputtering, atomic layer deposition (ALD), and the like. The first active layer 1027 may include a semiconductor material to define an active region of a first transistor (e.g., a read transistor). For example, the first active layer 1027 may include an oxide semiconductor, such as indium gallium zinc oxide (IGZO), and have a thickness of about 5 nm to 100 nm.

On the first active layer 1027, a first gate dielectric layer 1029 may be formed in a substantially conformal manner by deposition. For example, the first gate dielectric layer 1029 may include an oxide dielectric such as aluminum oxide ($Al_2O_3$), and have a thickness of about 2 nm to 30 nm.

Then, a first gate conductor layer 1031 may be formed by deposition. A remaining space in each opening may be filled with the first gate conductor layer 1031. The first gate conductor layer 1031 may include a conductor such as a conductive nitride, e.g., titanium nitride (TiN), a metal, e.g., tungsten (W), a conductive oxide, e.g., indium zinc oxide (IZO), and the like. The first gate conductor layer 1031 may be etched back through wet etching, RIE, atomic layer etching (ALE), and the like, so that a top surface of the first gate conductor layer 1031 is lowered to a vicinity of a top surface of the second connection line layer 1015.

Figure 8:
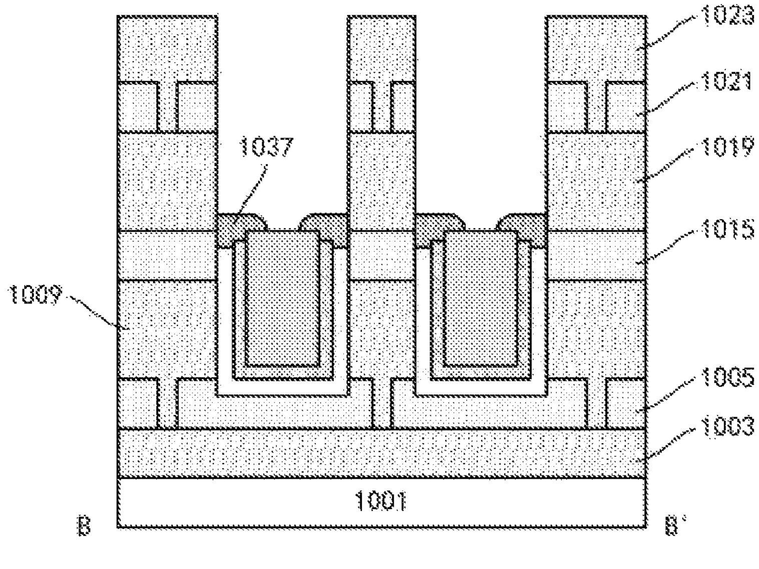

As shown in FIG. 8, the first gate dielectric layer 1029 and the first active layer 1027 may be selectively etched respectively by, for example, wet etching, dry etching, ALE, and the like, with the etched first gate conductor layer 1031 as a mask. A top surface of the first active layer 1027 may not exceed the top surface of the second connection line layer 1015.

As a result, the first transistor (e.g., the read transistor) is formed in each opening. As shown in FIG. 8, each first transistor may include the first active layer 1027. The first active layer 1027 may extend along a sidewall and a bottom wall of the opening to have a cup shape. Regions in the first active layer 1027 that are connected to the first connection line layer 1005 and the second connection line layer 1015 may respectively define the source/drain regions of the first transistor, and a portion between the source/drain regions is a channel region controlled by the first gate conductor layer 1031 (via the first gate dielectric layer 1029). A channel length or a gate length of the first transistor is defined by a spacing (or a thickness of the second isolation layer 1009 which is between the first connection line layer 1005 and the second connection line layer 1015) between the first connection line layer 1005 and the second connection line layer 1015.

A second transistor (e.g., a write transistor) may be formed above the first transistor in the opening. In order to achieve an isolation between the two transistors, especially an isolation between active regions, an isolation portion 1037 may be formed. Here, considering that the first active layer 1027 is along the sidewall of the opening, the isolation portion 1037 in a form of a spacer may be formed on the sidewall of the opening. For example, the spacer may be formed by depositing a layer of dielectric in a substantially conformal manner, and then anisotropic etching the deposited dielectric, such as RIE in the vertical direction, to remove a lateral extending portion of the deposited dielectric while leaving a vertical extending portion of the deposited dielectric. Considering the etching selectivity, for example, in a case that the previously formed isolation layers include an oxide, the isolation portion 1037 may include a nitride.

Here, the isolation portion 1037 is arranged along the sidewall of the opening, and the first gate conductor layer 1031 is exposed in a middle portion of the opening, so that the first gate conductor layer 1031 is subsequently electrically connected to the second transistor.

The second transistor may be similarly formed. For example, as shown in FIG. 9(*a*), FIG. 9(*b*), and FIG. 9(*c*), a second active layer 1041, a second gate dielectric layer 1043, and a second gate conductor layer 1045 may be sequentially formed above the first transistor in the opening. A formation method of the second active layer 1041, the second gate dielectric layer 1043, and the second gate conductor layer 1045 may be referred to the above description for the first active layer 1027, the first gate dielectric layer 1029, and the first gate conductor layer 1031 in conjunction with FIG. 7, except that a planarization process such as CMP may be performed after depositing the second gate conductor layer 1045, so that the second active layer 1041, the second gate dielectric layer 1043, and the second gate conductor layer 1045 may be left within the opening. Materials and thicknesses of the second active layer 1041, the second gate dielectric layer 1043, and the second gate conductor layer 1045 may be the same as or different from the materials and thicknesses of the first active layer 1027, the first gate dielectric layer 1029, and the first gate conductor layer 1031. In particular, the second active layer 1041 may include a semiconductor material with a relatively low leakage or relatively large bandgap width (e.g., with respect to silicon) to increase data retention capability, while the first active layer 1027 may include a semiconductor material with a relatively high mobility (e.g., with respect to silicon) to reduce a read time (or increase a read speed).

As a result, the second transistor (e.g., a write transistor) is formed in each opening. As shown in FIG. 9(*a*), FIG. 9(*b*), and FIG. 9(*c*), each second transistor may include the second active layer 1041. The second active layer 1041 may extend along the sidewall of the opening and the top surface of the first transistor (and the isolation portion 1037) to have a cup shape. A portion of the second active layer 1041 that is connected to the third connection line layer 1021 may define one source/drain region of the second transistor, and a portion of the second active layer 1041 that is connected to the first gate conductor layer 1031 may define another source/drain region of the second transistor. A portion between the source/drain regions is a channel region controlled by the second gate conductor layer 1045 (via the second gate dielectric layer 1043). A channel length or a gate length of the second transistor is mainly defined by the thickness of the third isolation layer 1019.

According to another embodiment of the present disclosure, as shown in FIG. 9(*d*), a connection portion 1041' may be formed in each opening before manufacturing the second transistor. For example, the connection portion 1041' may be formed by depositing a conductive material such as a metal, performing a planarization process such as CMP on the deposited conductive material, and etching back the planarized conductive material. A contact resistance with the first gate conductor layer 1031 may be reduced through the connection portion 1041'. In addition, a position of the bottom portion of the second gate conductor layer 1045 of the second transistor may be adjusted through the connection portion 1041', which may be conductive to controlling the gate length of the second transistor as described below.

In addition, a fourth connection line layer may be formed on the fourth isolation layer 1023. For example, as shown in FIG. 10(*a*), FIG. 10(*b*), and FIG. 10(*c*), a fifth isolation layer 1047 may be formed, for example, by deposition. The fifth isolation layer 1047 may include a dielectric material such as an oxide, a nitride, a carbide, and the like to achieve electrical isolation. In the fifth isolation layer 1047, an opening corresponding to the second gate conductor layer 1045 of each second transistor and a groove extending in a direction (e.g., a second direction) that intersects (e.g., perpendicular to) the conductive line (e.g., the third conductive line in the third connection line layer 1021) in the adjacent connection line layer may be formed, for example, by a dual Damascus process. The opening and groove thus formed in the fifth isolation layer 1047 may be filled with the conductive material, for example, by deposition followed by planarization. A conductive material filled into the opening of the fifth isolation layer 1047 may form a contact plug 1049, while a conductive material filled into the groove of the fifth isolation layer 1047 may form a fourth conductive line 1051.

In this way, the memory cell according to the embodiment is obtained.

Figure 15:
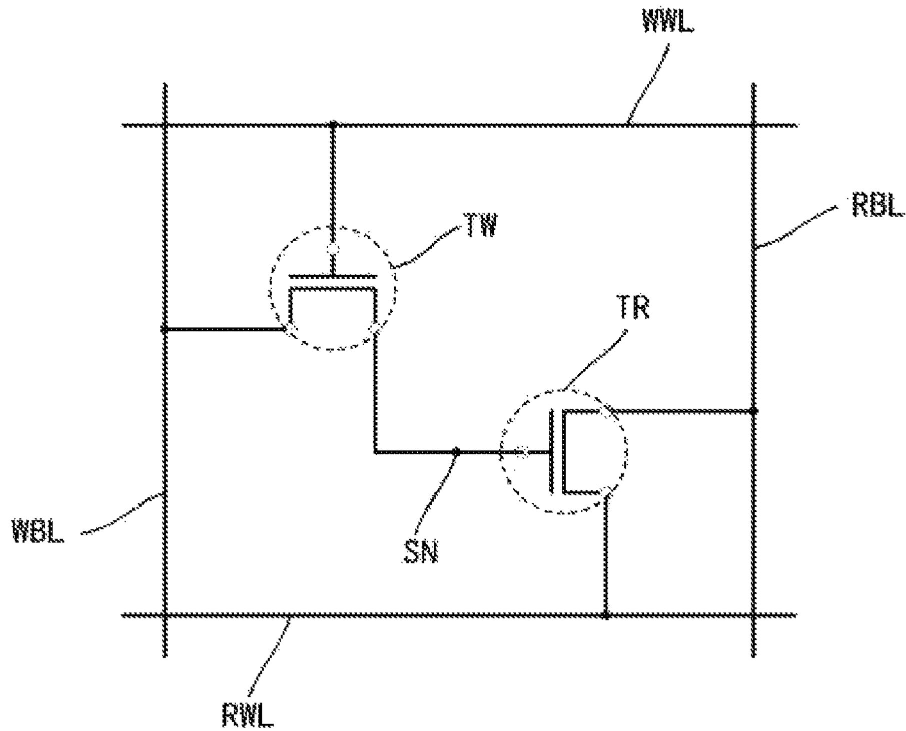

As shown in FIG. 15, the first transistor serving as a read transistor TR may be connected between the first conductive line (e.g., one of RBL and RWL) in the first connection line layer 1005 and the second conductive line (e.g., the other of RBL and RWL) in the second connection line layer 1015, while the second transistor serving as a write transistor TW may be connected between the third conductive line (e.g., WBL) in the third connection line layer 1021 and a gate electrode of the read transistor TR, and its gate electrode is electrically connected to the fourth conductive line 1051 (e.g., WWL) in the fourth connection line layer.

In the memory cell, a memory element such as a capacitor may not be additionally provided, and a gate capacitance of the read transistor TR may serve as the memory element. A node between the write transistor and the read transistor is a memory node SN. Accordingly, the 2T0C configuration is obtained.

For example, a voltage of 0 V may be applied on the RWL, and a voltage of 0.8 V may be applied on the RBL. A voltage of 1 V may be applied on the WWL, and a voltage of 1 V may be applied on the WBL to store charges in the gate capacitance of the read transistor TR, so as to achieve a writing of data "1". After writing the data, a voltage of −2 V may be applied on the WWL and a voltage of 0 V may be applied on the WBL to turn off the write transistor TW. In addition, during a read operation, for example, a drain current of the read transistor TR may be monitored through the RBL, and a variation of a voltage at the memory node SN with time may be indirectly inferred based on a monitored current, thereby obtaining whether there is any charge stored in the gate capacitance of the read transistor TR (that is, whether data "0" or data "1" is stored).

In the above-mentioned embodiment, the gate length of the second transistor is mainly but not completely defined by the thickness of the third isolation layer 1019, and thus there may be a significant process fluctuation. According to embodiments of the present disclosure, the gate length of the second transistor may be more accurately controlled.

Figure 11A:
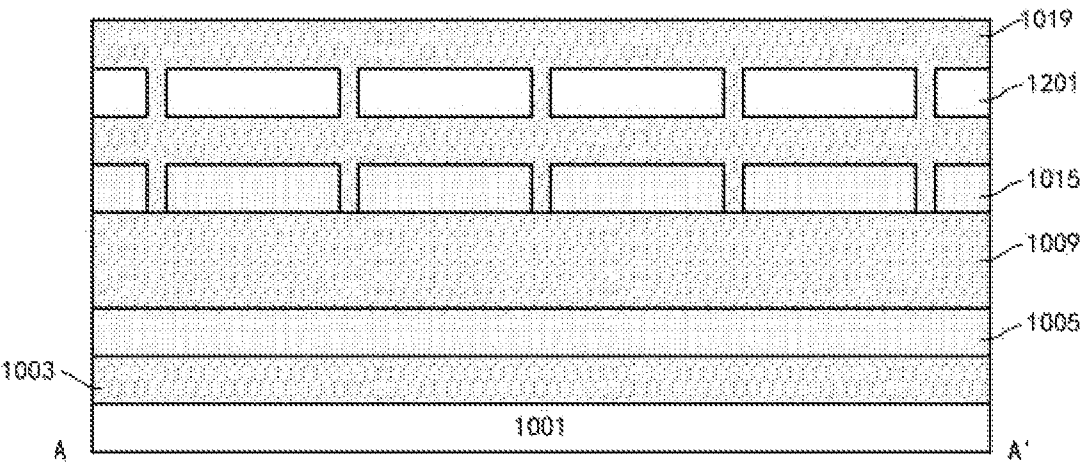
FIG. 11(*a*) to FIG. 14(*b*) show schematic diagrams of some stages in a process of manufacturing a memory device according to another embodiment of the present disclosure.
Figure 11B:
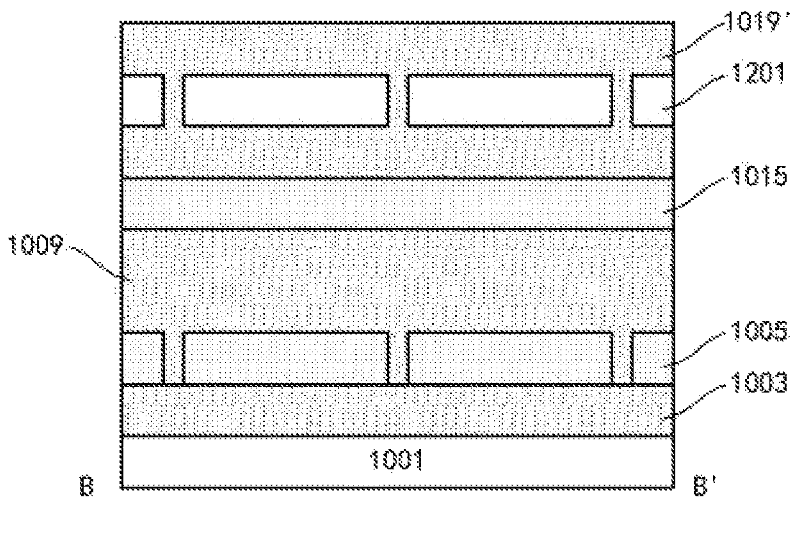
Figure 14A:
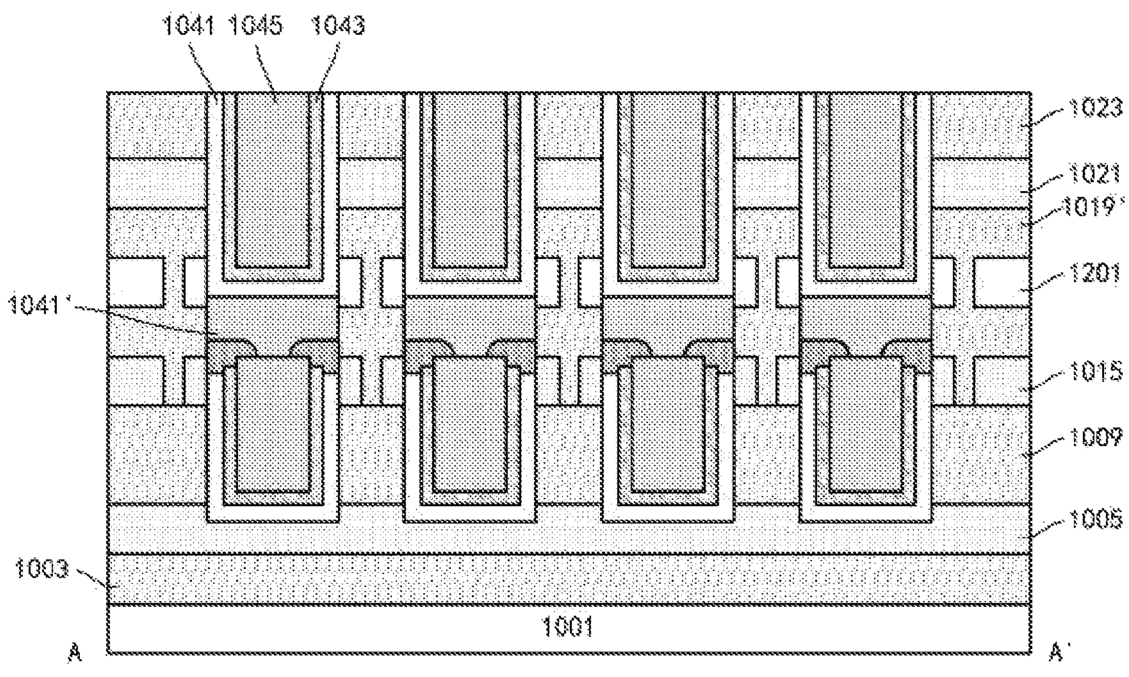
Figure 14B:
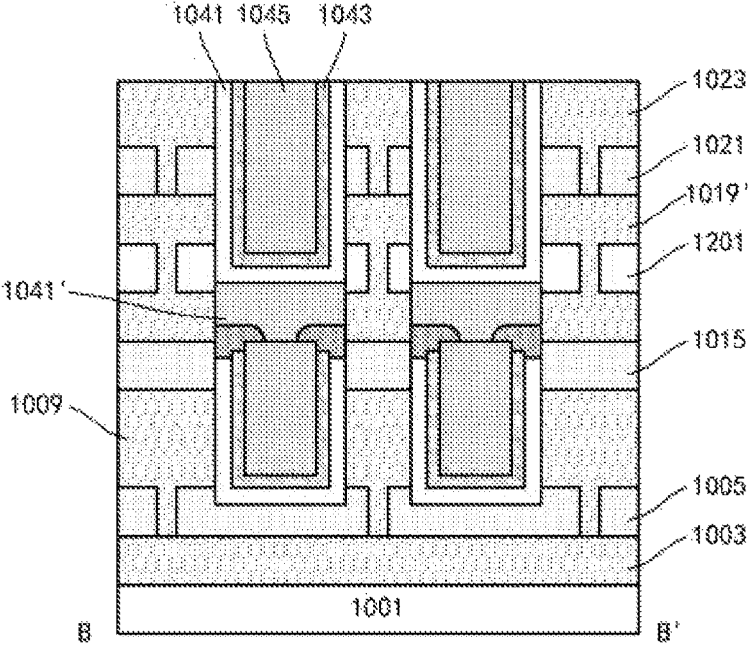

FIG. 11(*a*) to FIG. 14(*b*) show schematic diagrams of some stages in a process of manufacturing a memory device according to another embodiment of the present disclosure.

Hereinafter, a difference between this embodiment and the above-mentioned embodiment will be mainly described.

As described above in conjunction with FIG. 1(*a*) to FIG. 4(*b*), a first isolation layer 1003, a first connection line layer 1005, a second isolation layer 1009, and a second connection line layer 1015 may be sequentially formed on a substrate 1001. Similarly, a third isolation layer 1019' may be formed on the second connection line layer 1015, with a difference that a gate length control layer 1201 may be inserted into the third isolation layer 1019', as shown in FIG. 11(*a*) and FIG. 11(*b*). For example, a lower portion of the third isolation layer 1019' may be formed on the second connection line layer 1015 in the same manner as forming the third isolation layer 1019 described above. On the lower portion of the third isolation layer 1019', the gate length control layer 1201 may be formed, for example, by deposition. The gate length control layer 1201 may include a conductive material such as a metal, e.g., Mo, Ru, and the like, and have a thickness of, for example, about 10 nm to 150 nm. The gate length control layer 1201 may be patterned as a gate length control pad corresponding to each memory cell by selective etching such as RIE. For example, the gate length control layer 1201 may be patterned based on the above combined pattern (the pattern shown in FIG. 1(*a*)+the pattern shown in FIG. 3(*a*)) of a mask for patterning the first connection line layer and a mask for patterning the second connection line layer, so that the obtained gate length control pad may be located at an intersection (for example, please refer to an approximately square area surrounded by dotted lines shown in FIG. 6 (*a*)) of the first conductive line in the first connection line layer and the second conductive line in the second connection line layer. Then, an upper portion of the third isolation layer 1019' may be formed on the gate length control layer 1201 in the same manner as forming the third isolation layer 1019 described above.

Figure 12A:
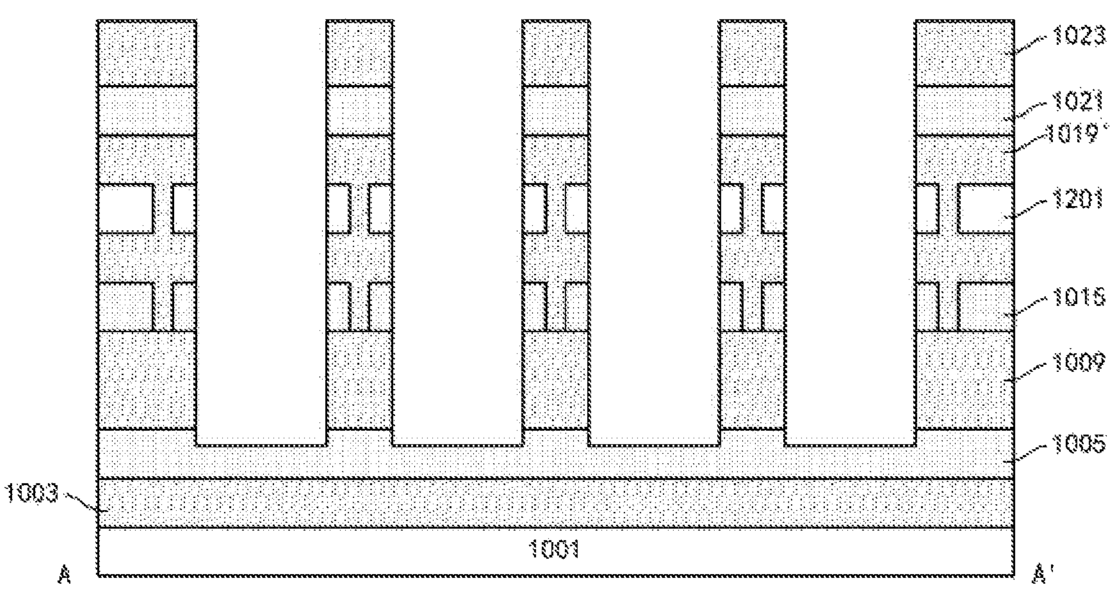
Figure 12B:
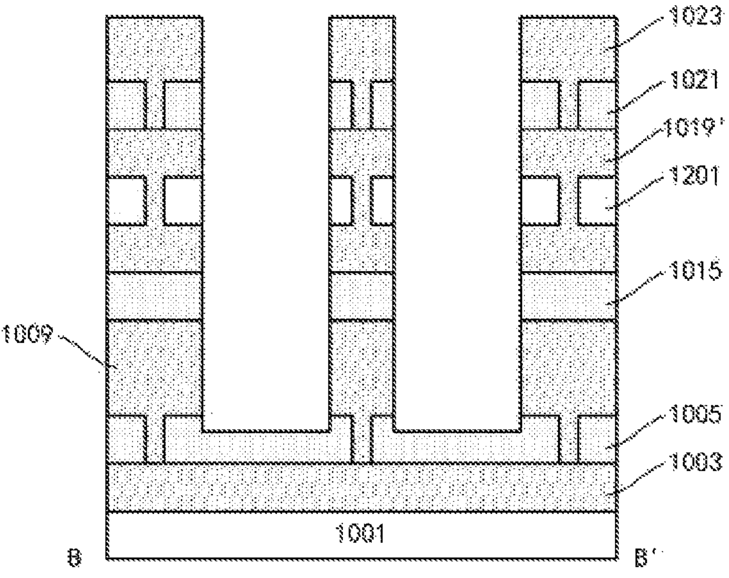
Figure 13A:
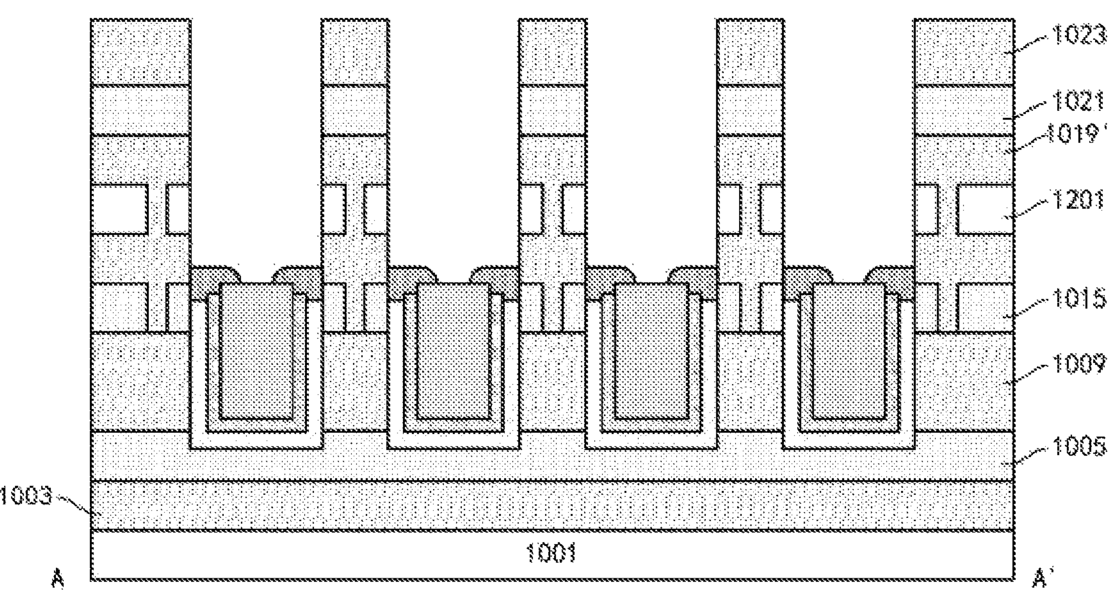
Figure 13B:
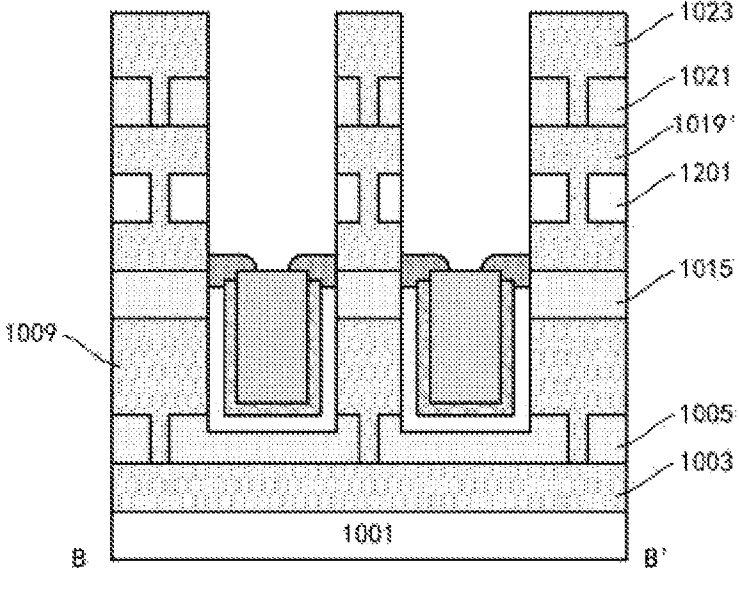

Next, the process may be performed as in the above-mentioned embodiments. For example, as shown in FIG. 12(*a*) and FIG. 12(*b*), a space used for the active region of the transistor in the memory cell may be defined, that is, a series of openings arranged in an array may be formed. Similarly, such openings also pass through corresponding gate length control pads in the gate length control layer 1201. Then, as shown in FIG. 13(*a*) and FIG. 13(*b*), the first transistor may be formed in the openings, and the second transistor may be formed above the first transistor in the openings, as shown in FIG. 14(*a*) and FIG. 14(*b*).

Here, the connection portion 1041' is provided to better define the lower end of the channel region of the second transistor. More specifically, the top surface of the connection portion 1041' may be located between the top surface of the gate length control layer 1201 and the bottom surface of the gate length control layer 1201 (and thus the top surface of the connection portion 1041' is connected to the gate length control layer 1201), so that the lower portion of the second active layer 1041 is surrounded by a conductive material such as a metal (the connection portion 1041', the gate length control pad in the gate length control layer 1201), and thus is defined as a lower source/drain region. A top portion of the lower source/drain region is defined by the top surface of the gate length control layer 1201. On the other hand, a bottom portion of the upper source/drain region is defined by the bottom surface of the third connection line layer 1021. Accordingly, the length of the channel region (or the gate length) between the upper source/drain region and the lower source/drain region may be determined by a spacing between the top surface of the gate length control layer 1201 and the bottom surface of the third connection line layer 1021, i.e., a thickness of the upper portion of the third isolation layer 1019' (a thickness above the gate length control layer 1201). Here, the bottom surface of the gate conductor layer 1045 is located between the top surface of the gate length control layer 1201 and the bottom surface of the gate length control layer 1201, so as to cover an entire vertical range of the spacing or the thickness.

In this example, the top surface of the connection portion 1041' is shown to be substantially flat and located between the top surface of the gate length control layer 1201 and the bottom surface of the gate length control layer 1201. However, the present disclosure is not limited to this. The top surface of the connection portion 1041' may not be flat, but may have a shape such as being lower in the middle portion of the opening and higher near the sidewall of the opening, especially in a case of a thinner opening. Alternatively, the connection portion 1041' may be omitted. In such cases, the bottom portion of the second active layer 1041 may also extend unevenly on the lower structure, such as extend on the connection portion 1041' (lower in the middle portion and higher on both sides), or extend on the gate conductor layer 1031 and the isolation portion 1037 as in the above-mentioned embodiments in the case that the connection portion 1041 is omitted. At this point, the bottom surface of the gate conductor layer 1045 may not be flat, and a lowest part of the bottom surface of the gate conductor layer 1045 may be lower than the top surface of the gate length control pad. so as to cover the entire vertical range of the spacing or the thickness.

The memory device according to embodiments of the present disclosure may be applied to various electronic apparatuses. For example, the memory device may store various programs, applications, and data required for the operation of electronic apparatus. The electronic apparatus may further include a processor cooperating with the memory device. For example, the processor may operate the electronic apparatus by executing programs stored in the memory device. The electronic apparatus may include, for example, a smart phone, a personal computer (PC), a tablet computer, an artificial intelligence apparatus, a wearable apparatus, a mobile power supply, and so on.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

Embodiments of the present disclosure have been described above. However, the embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A memory device, comprising:

a first connection line layer, a second connection line layer, and a third connection line layer that are sequentially disposed in a vertical direction with respect to a substrate, wherein the first connection line layer comprises a plurality of first conductive lines extending parallel to each other in a first direction, the second connection line layer comprises a plurality of second conductive lines extending parallel to each other in a second direction intersecting the first direction, and the third connection line layer comprises a plurality of third conductive lines extending parallel to each other in the first direction;

a plurality of memory cells, wherein each memory cell extends vertically from a corresponding first conductive line in the first connection line layer and passes through a corresponding second conductive line in the second connection line layer and a corresponding third conductive line in the third connection line layer, and each memory cell comprises a first transistor and a second transistor that are stacked on each other in the vertical direction, wherein the first transistor comprises:

a first active layer, comprising a first source/drain region electrically connected with the corresponding first conductive line in the first connection line layer, a second source/drain region electrically connected with the corresponding second conductive line in the second connection line layer, and a channel region between the first source/drain region of the first transistor and the second source/drain region of the first transistor;

a first gate dielectric layer on the first active layer; and a first gate conductor layer on the first gate dielectric layer, and wherein the second transistor comprises:

a second active layer, comprising a first source/drain region electrically connected with the first gate conductor layer, a second source/drain region electrically connected with the corresponding third conductive line in the third connection line layer, and a channel region between the first source/drain region of the second transistor and the second source/drain region of the second transistor, wherein portions where the first active layer is adjacent to the second active layer are aligned in the vertical direction;

a second gate dielectric layer on the second active layer; and a second gate conductor layer on the second gate dielectric layer; and a fourth connection line layer above the memory cell, comprising a plurality of fourth conductive lines extending in the second direction, wherein the second gate conductor layer of each memory cell is electrically connected to a corresponding fourth conductive line in the fourth connection line layer.

2. The memory device according to claim 1, wherein portions where an outer sidewall of the first active layer is adjacent to an outer sidewall of the second active layer are coplanar in the vertical direction.

3. The memory device according to claim 1, wherein the first active layer has a bottom portion and a vertical extending portion extending vertically upward from the bottom portion, wherein the bottom portion is in physical contact with the corresponding first conductive line in the first connection line layer, and the vertical extending portion is in physical contact with the corresponding second conductive line in the second connection line layer.

4. The memory device according to claim 3, wherein the first gate dielectric layer extends along an inner wall of the first active layer, and an inner space of the first gate dielectric layer is filled with the first gate conductor layer.

5. The memory device according to claim 3, wherein the second active layer has a bottom portion and a vertical extending portion extending vertically upward from the bottom portion of the second active layer, wherein the bottom portion of the second active layer is electrically connected with the first gate conductor layer, and the vertical extending portion of the second active layer is in physical contact with the corresponding third conductive line in the third connection line layer.

6. The memory device according to claim 5, wherein the bottom portion of the second active layer is in physical contact with the first gate conductor layer.

7. The memory device according to claim 5, wherein the memory cell further comprises:

a connection portion between the first transistor and the second transistor, wherein the bottom portion of the second active layer is electrically connected with the first gate conductor layer through the connection portion.

8. The memory device according to claim 5, wherein the second gate dielectric layer extends along an inner wall of the second active layer, and an inner space of the second gate dielectric layer is filled with the second gate conductor layer.

9. The memory device according to claim 5, wherein the vertical extending portion of the first active layer is aligned with the vertical extending portion of the second active layer in the vertical direction.

10. The memory device according to claim 5, further comprising:

a gate length control layer between the second connection line layer and the third connection line layer, wherein the gate length control layer comprises a gate length control pad disposed around the memory cell, and a lowest part of a bottom surface of the second gate conductor layer is lower than a top surface of the gate length control pad.

11. The memory device according to claim 7, further comprising:

a gate length control layer between the second connection line layer and the third connection line layer, wherein the gate length control layer comprises a gate length control pad disposed around the memory cell, a bottom surface of the second gate conductor layer is at a vertical height between a top surface of the gate length control pad and a bottom surface of the gate length control pad, and a top surface of the connection portion is not lower than the bottom surface of the gate length control pad.

12. The memory device according to claim 5, wherein the memory cell further comprises:

an isolation portion in a form of spacer between the first active layer and the second active layer.

13. The memory device according to claim 12, wherein the vertical extending portion of the first active layer, the vertical extending portion of the second active layer, and an outer sidewall of the isolation portion are coplanar in the vertical direction.

14. The memory device according to claim 1, wherein at least one of the first active layer and the second active layer comprises indium gallium zinc oxide.

15. The memory device according to claim 1, wherein the first active layer comprises a semiconductor material with a relatively high mobility with respect to silicon, and the second active layer comprises a semiconductor material with a relatively low leakage or a relatively large bandgap width with respect to silicon.

16. The memory device according to claim 1, wherein the first active layer and the second active layer are self-aligned in the vertical direction.

17. The memory device according to claim 16, wherein the memory cell further comprises:

an isolation portion in a form of spacer between the first active layer and the second active layer, wherein the first active layer, the second active layer, and the isolation portion are self-aligned in the vertical direction.

18. The memory device according to claim 1, wherein the memory device is a dynamic random access memory, the first conductive line corresponds to one of a read word line and a read bit line, the second conductive line corresponds to the other of the read word line and the read bit line, the third conductive line corresponds to a write bit line, and the fourth conductive line corresponds to a write word line.

19. An electronic apparatus, comprising the memory device according to claim 1.

20. The electronic apparatus according to claim 19, wherein the electronic apparatus comprises a smart phone, a personal computer, a tablet computer, an artificial intelligence device, a wearable device or a mobile power supply.

* * * * *